United States Patent [19]
Hirabayashi et al.

[11] Patent Number: 5,720,808
[45] Date of Patent: Feb. 24, 1998

[54] METHOD FOR FORMING DIAMOND FILM

[75] Inventors: Keiji Hirabayashi, Tokyo; Toshiaki Yoshikawa, Kawasaki, both of Japan

[73] Assignee: Canon Kabushiki Kaisha, Tokyo, Japan

[21] Appl. No.: 502,703

[22] Filed: Jul. 14, 1995

[30] Foreign Application Priority Data

Jul. 18, 1994 [JP] Japan .................................. 6-165182

[51] Int. Cl.$^6$ .................................. C30B 29/02
[52] U.S. Cl. .................. 117/103; 117/929; 423/446; 427/577
[58] Field of Search ................ 117/929, 103; 423/446; 427/577

[56] References Cited

U.S. PATENT DOCUMENTS

| | | | |
|---|---|---|---|
| 4,898,748 | 2/1990 | Kruger | 427/577 |
| 5,053,243 | 10/1991 | Schuurmans et al. | 427/488 |
| 5,087,434 | 2/1992 | Frenklach et al. | 427/577 |
| 5,349,154 | 9/1994 | Harker et al. | 117/102 |
| 5,380,516 | 1/1995 | Keiichiro et al. | 423/446 |
| 5,418,018 | 5/1995 | Rudder et al. | 427/577 |

FOREIGN PATENT DOCUMENTS

| | | | |
|---|---|---|---|
| 0539050 | 4/1993 | European Pat. Off. | C23C 16/26 |
| 1-256766 | 8/1991 | Japan | 117/103 |
| 0532489 | 2/1993 | Japan . | |

OTHER PUBLICATIONS

Patent Abstracts of Japan, vol. 017 No. 321 (C–1072), Jun. 18, 1993.

Meyer, D.E., et al "R.F. Plasma CVD Of Diamond From $H_2/CH_4$, $H_2/CO$ And $H_4/CH_1/O_2$ Source Gases", Extended Abstracts, Spring Meeting, Los Angeles, CA., vol. 89/1, May 7, 1989.

Suzuki, J., et al. "The Synthesis of Diamond Films At Lower Pressure And Lower Temperature Using Magneto–Microwave Plasma CVD", Japanese Journal of Applied Physics, Part 2 (Letters), Feb. 1989, Japan, vol. 28, No. 2, pp. L281–L283.

*Primary Examiner*—Robert Kunemund
*Attorney, Agent, or Firm*—Fitzpatrick, Cella, Harper & Scinto

[57] ABSTRACT

In a method for forming a diamond film by a high-frequency plasma CVD method, an inductive coupling discharge is used and the frequency of a high-frequency wave is set in the range of from 40 to 250 MHz, whereby a starting gas containing carbon is decomposed in a plasma state and a diamond film is formed on a substrate.

7 Claims, 3 Drawing Sheets

METHOD FOR FORMING DIAMOND FILM

BACKGROUND OF THE INVENTION

1. Field of the Invention

The present invention relates to a method for forming a diamond crystal film, which exhibits excellent properties when used as an electronic material or a high-wear resisting material.

2. Related Background Art

Diamond has various properties which are not obtainable with other materials, such as a greatband gap (5.5 eV), great carrier mobilities (1800 $cm^2$/V·S for electrons, 1600 $cm^2$/V·S for holes), a great thermal conductivity [2000 W/(m·K)], and high hardness and excellent wear resistance.

There has been recent progress in studies for synthesizing diamond in a vapor phase, particularly in studies of the chemical vapor deposition method (CVD method).

The main methods for forming diamond are as follows:

(1) A hot filament CVD method in which a filament, for example, of tungsten is heated to about 2000° C. to decompose a starting gas, and then to deposit diamond crystals on a substrate.

(2) A microwave plasma CVD method in which a starting gas is decomposed by microwave (usually 2.45 GHz) plasma thereby to deposit diamond crystals on a substrate.

(3) An RF plasma CVD method in which a starting gas is decomposed by RF (usually 13.56 MHz) plasma thereby to deposit diamond crystals on a substrate.

(4) A burning flame method in which diamond crystals are formed using an oxygen-acetylene flame.

(5) An ECR plasma CVD method in which a starting gas is decomposed by ECR (electron cyclotron resonance) discharge caused by a combination of a microwave with a magnetic field thereby to form diamond crystals on a substrate.

(6) A hot plasma CVD method in which a starting gas is decomposed by hot plasma caused by a direct current or a high-frequency wave under a pressure in the vicinity of the atmospheric pressure thereby to form diamond crystals on a substrate.

(7) A plasma CVD method using plasma in the ultrashort wave (30–300 MHz) region, as disclosed in Japanese Patent Application Laid-open No. 5-32498.

However, the above conventional methods for forming diamond crystals had the following problems:

The hot filament CVD method (1) has a capability of forming a large-area diamond film and shows a relatively high rate of forming diamond crystals. On the other hand, the filament is carbonized or degraded with time and reproducibility of diamond formation is poor.

The microwave plasma CVD method (2) can achieve a high plasma density, a relatively high rate of formation of diamond crystals, and good reproducibility. However, the plasma is likely to be localized and it is difficult to form a large-area diamond film.

The RF plasma CVD method (3) is capable of forming a large-area film and good reproducibility. However, the plasma density is low and the formation rate of diamond crystals is very low.

The burning flame method (4) can achieve a very high rate of forming diamond crystals. However, the reproducibility is poor and it is difficult to form a large-area film.

The ECR plasma CVD method (5) is capable of forming a large-area film and good reproducibility. On the other hand, a low pressure (usually not more than 100 Pa) is required for generation of ECR discharge, which results in a low forming rate of diamond crystals.

The hot plasma CVD method (6) has a very high rate of forming diamond crystals and good reproducibility. However, it is difficult to form a large-area film.

The plasma CVD method (7) using the high-frequency wave in the ultrashort wave region readily forms a large-area film with high reproducibility. In addition, high plasma density provides a relatively high diamond forming rate, but a further improvement in the diamond forming rate has been desired.

SUMMARY OF THE INVENTION

The present invention overcomes the above-described problems. An object of the present invention is to provide a method for uniformly forming a diamond crystal film with good reproducibility, at a high speed, and over a large area.

The above object can be accomplished by a method for forming a diamond film by a high-frequency plasma CVD method, which comprises applying an inductive coupling discharge and setting a frequency of a high-frequency wave in the range of 40 to 250 MHz, thereby decomposing a starting gas containing carbon in a plasma state and forming a diamond film on a substrate.

DESCRIPTION OF THE PREFERRED EMBODIMENTS

Figure 1:
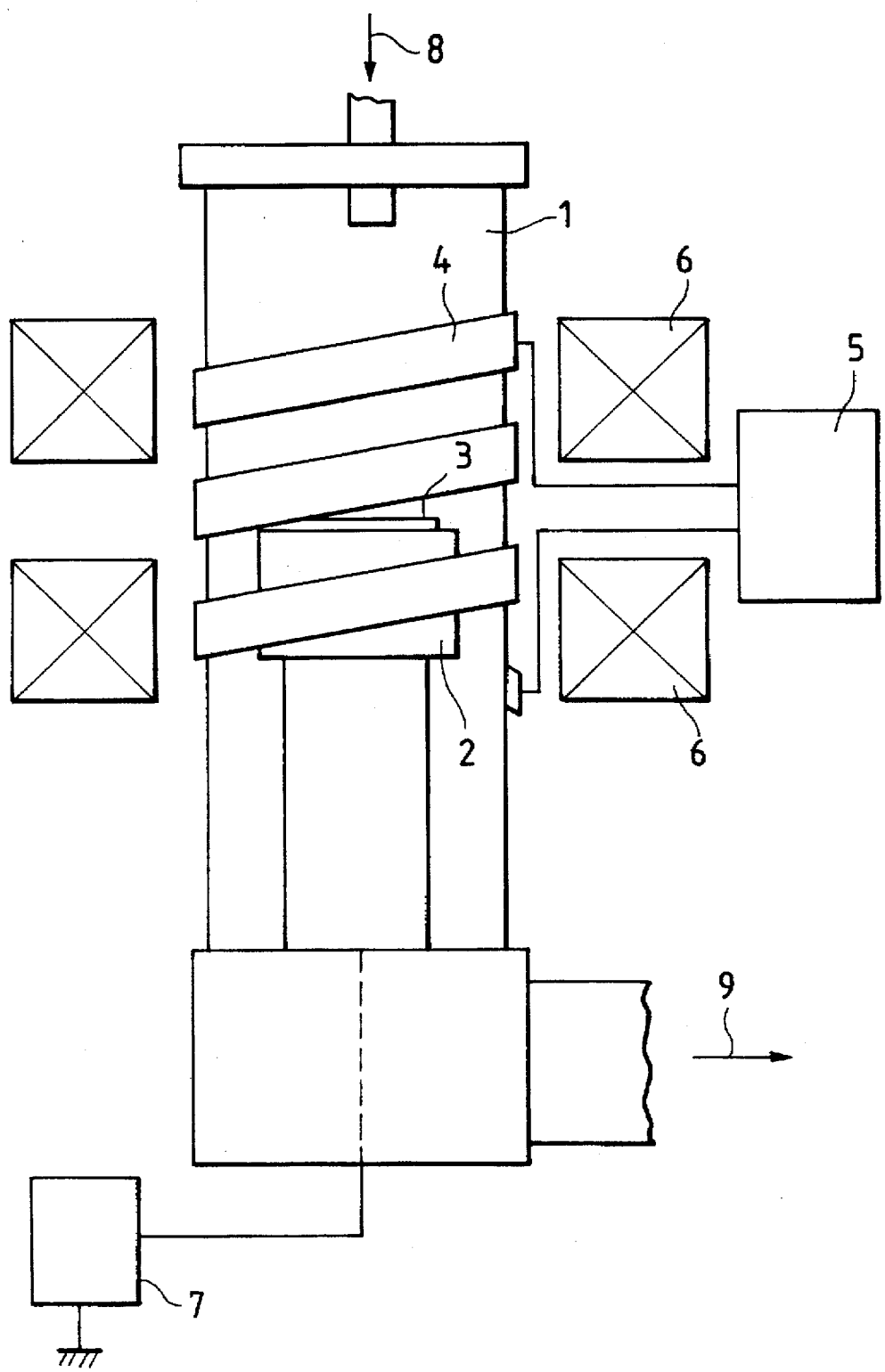
FIG. 1 shows an embodiment of a plasma CVD apparatus used in the present invention.

The present invention will be described in detail below.

The present invention has been accomplished based on reexamination of the method for forming a diamond crystal or diamondlike carbon film at a high forming rate and also over a large area, particularly the method for generating plasma.

In the microwave discharge (usually 2.45 GHz), the plasma density is high, but the plasma tends to be localized, thus making it difficult to form a large-area film, as described above. On the other hand, in the RF discharge (usually 13.56 MHz), the plasma is likely to spread so as to make it possible to form a large-area film, but the plasma density is low.

Thus, the inventor tried forming diamond by a CVD method using plasma discharge at a frequency in an intermediate region between those in the above two methods, particularly in the region of from 40 MHz to 250 MHz, preferably in the region of from 80 MHz to 200 MHz, in order to form high-density plasma in a wide region. As a result, it was found that plasma could be generated in a wide region and at a high plasma density, whereby diamond crystals could be formed at a high a large area. A method for applying a high-frequency wave in this frequency region includes using discharge with a capacitive coupling electrode or discharge with an inductive coupling electrode, etc. The present invention employs the inductive coupling electrode for the method of applying the high-frequency wave, thereby forming plasma at a further high density and thus improving the forming rate of diamond crystals.

If the frequency of the high-frequency wave applied in the plasma CVD method of the present invention is lower than 40 MHz, high diamond crystal forming rates cannot be obtained because of impact of ions having high energy, i.e. at least 100 eV, and crystallinity is degraded. On the other hand, if the frequency of the high-frequency wave is higher than 250 MHz, transmission losses of high-frequency power increase, so that the plasma cannot be stably generated.

Synthesis of diamond by the CVD method is carried out under a relatively high pressure (preferably at least 10 Pa) as compared with the general CVD methods. The inductive coupling discharge method according to the present invention can realize more stable discharge than the capacitive coupling discharge method, and thus is suitable for prolonged diamond synthesis. This is because the discharge using the capacitive coupling discharge method under a relatively high pressure (preferably at least 10 Pa) is likely to give rise to abnormal discharge between electrodes, particularly in the frequency band of the present invention (40–250 Hz); in contrast, the abnormal discharge can be suppressed by using the inductive coupling discharge method, whereby a stable discharge state can be formed, thus achieving good uniformity of film thickness.

Further, it is generally said that it is more difficult for the inductive coupling discharge method to form a large-area film than for the capacitive coupling discharge method. However, in the frequency band of the present invention (40–250 Hz), stability of discharge is high and the great electric power of the high-frequency wave can be stably supplied becomes possible to form diamond over a larger area and at a higher forming rate than using the capacitive coupling discharge method.

Furthermore, by using the inductive coupling discharge method of the present invention, the substrate can be heated by inductive coupling heat without using a heater or the like. This is particularly effective in deposition of diamond, which requires a relatively high substrate temperature (preferably at least 400° C.).

As described above, the method of the present invention applies the inductive coupling discharge method and also selectively applies a specific high-frequency band (40–250 MHz) to forming a diamond film by the plasma CVD method, whereby a uniform diamond film having excellent properties can be formed on a stable basis.

Further, in the present invention, a magnetic field is applied to the vicinity of the substrate and/or a positive bias voltage is applied to the substrate during formation of diamond, whereby diamond crystals can be formed at a higher formation rate.

The following method and conditions are preferred as the method and conditions for applying the magnetic field according to the present invention. First, when a usual divergent magnetic field is used in the method for applying the magnetic field, the strength of the magnetic field in the vicinity of the substrate is at least 150 gausses, preferably at least 200 gausses. A magnetic field weaker than 150 gausses will fail to achieve the effect of improving the diamond forming rate based on the improvement in the plasma density.

In addition, application of the positive bias voltage to the substrate during formation of diamond in the present invention decreases the impact of ions on the substrate and the diamond crystal deposited thereon, and also effects appropriate irradiation thereof with electron beams. This improves the growth rate and crystallinity of diamond crystals. The optimum value of application condition of the positive bias voltage differs depending on the frequency of high-frequency wave, the high-frequency power, the pressure, etc., but it is between 20 V and 50 V both inclusive, preferably between 25 V and 45 V both inclusive. There are some cases where the substrate and the diamond film are etched by impact of ions in plasma with application of a positive bias voltage lower than 20 V or application of a negative bias voltage, so as to considerably reduce the diamond film formation rate or to form no diamond film at all. Further, if the voltage is higher than 50 V, the irradiation of electron beams to the substrate increases and raises the substrate temperature abnormally, which could be a factor inhibiting the diamond formation.

A carbon source in the starting gas used in the formation of diamond film of the present invention may be a hydrocarbon gas such as methane, ethane, ethylene, acetylene, etc., liquid organic compound such as an alcohol, acetone, etc., carbon monoxide, or a halogenated carbon, etc. Further, a gas containing hydrogen, oxygen, chlorine or fluorine can be optionally added. Generally, the starting gas is a gas mixture in the ratio of hydrogen and the carbon source gas, which are main components in the starting gas, of from 1:0.001 to 1:1. For forming semiconductor diamond, a gas containing boron is added to the starting gas to obtain p-type semiconductors while a gas containing phosphorus or lithium, sodium, etc. is added to obtain n-type semiconductors. Furthermore, when an evaporated liquid organic compound is used as the carbon source, either one of boron, phosphorus, lithium, or sodium as listed above, or a compound thereof can be added into the liquid organic compound.

The substrate temperature is, for example, in the range of from 300° C. to 1200° C., preferably from 400° C. to 1000° C.

The pressure is, for example, in the range of from 1 Pa to $10^4$ Pa, preferably from 10 Pa to $8 \times 10^3$ Pa, more preferably from $10^2$ Pa to $5 \times 10^3$ Pa.

FIG. 1 shows an embodiment of the plasma CVD apparatus used in the present invention. In the apparatus of the present invention, a quartz reactor 1, arranged as capable of reducing the pressure therein, encloses a substrate holder 2, arranged as capable of heating and cooling the substrate and applying the substrate bias voltage to the substrate, and a substrate 3. An inductive coupling coil 4 is disposed outside the reactor, and is connected to an unrepresented high-frequency power supply via a matching circuit 5. A magnetic field applying means 6 is disposed outside the inductive coupling coil 4 in order to apply a magnetic field in the direction perpendicular to the substrate surface. Further, reference numeral 7 is a power supply for the substrate bias voltage. Reference numeral 8 designates a gas supply port, to which a valve, a gas cylinder, and a gas-flow-rate regulator, not shown, are connected. Reference numeral 9 denotes a vacuum exhaust port, to which a valve, a turbo-molecular pump, and a rotary pump, not shown, are connected.

FIG. 1 shows a 3-winding inductive coupling coil, but it is noted that the shape of coil, the number of windings, the layout, etc. in the present invention are not limited to those shown in FIG. 1. For example, the number of windings can be from 1 to 10 windings, and a plurality of coils can be further arranged in a line to enlarge the plasma-forming region, whereby diamond crystals can be formed on a long-size substrate.

The present invention will be described in further detail with reference to examples to follow.

EXAMPLE 1

A diamond crystal was formed, using the CVD apparatus as shown in FIG. 1, in this example.

Figure 2:
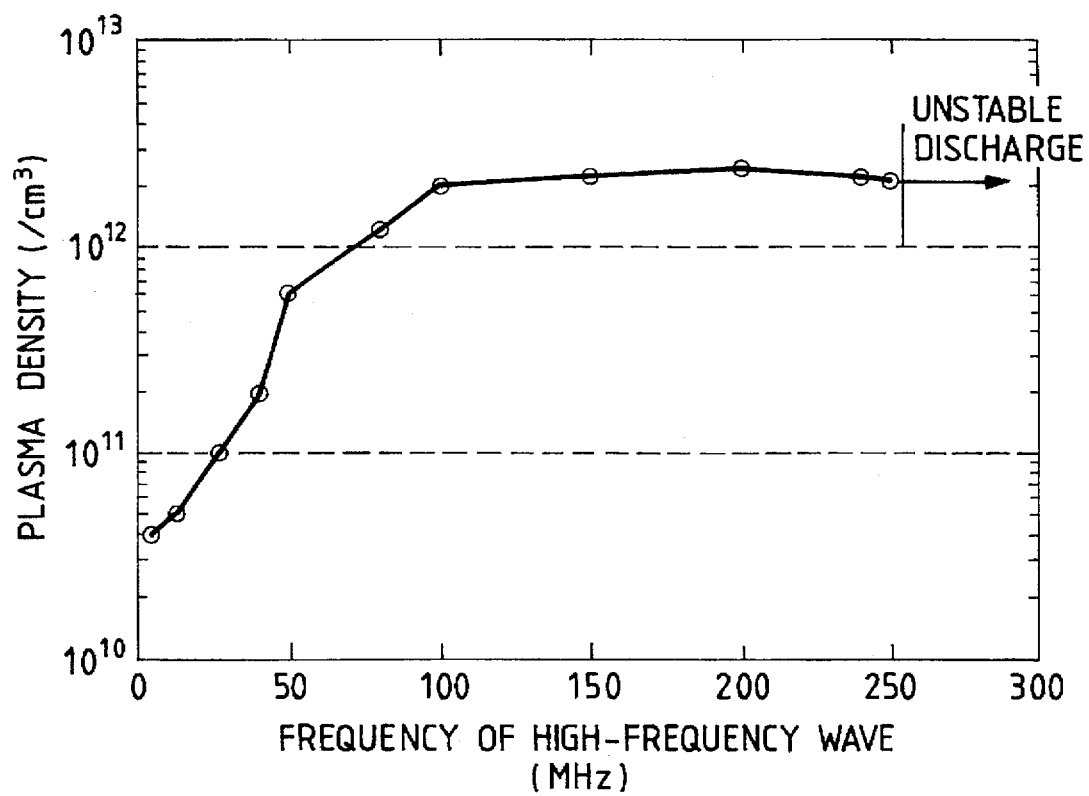
FIG. 2 is a drawing to show a dependence of plasma density on frequency.

Before forming diamond crystals, a dependence of plasma density on frequency was measured by the well-known two point probe method. Plasma was generated at various frequencies to measure plasma densities, using the starting gas composed of hydrogen: 200 ml/min, methane: 2 ml/min, and oxygen: 0.5 ml/min, the pressure of 50 Pa, and the high-frequency power of 500 W. Results thus obtained are shown in FIG. 2. When the frequency is less than 40 MHz, the plasma density is less than $1 \times 10^{11}/cm^3$. The plasma density increases above the frequency of 40 MHz as a border. The plasma density becomes about $10^{12}/cm^3$ at about 80 MHz, and tends to be saturated when the frequency exceeds 80 MHz. Further, when the frequency exceeds 200 MHz, transmission losses of high-frequency power increase. Furthermore, when the frequency exceeds 250 MHz, generation of plasma becomes unstable and it becomes impossible to carry out continuous operation over 30 minutes.

Next, diamond was formed while the frequency of high-frequency wave was fixed at 100 MHz. A monocrystalline silicon substrate (diameter: 4 inches, thickness: 400 μm) was used as the substrate 3 and was heated to 750° C. with a heater. The other conditions were the same as those in the measurement of the plasma density. Further, the substrate was kept at the ground potential and no magnetic field was applied to the substrate. Formation of diamond was continued for 10 hours to obtain a polycrystalline diamond film in the film thickness of about 2.5 μm. Here, variations of the film thickness was within ±10%, which was acceptable.

EXAMPLE 2

Diamond crystals were synthesized at various frequencies, using the CVD apparatus as shown in FIG. 1.

The forming conditions were as follows: the starting gas was composed of hydrogen: 400 ml/min, methane: 4 ml/min, and oxygen: 1 ml/min; the pressure was 500 Pa; and the high-frequency power was 720 W. A monocrystalline silicon substrate (diameter: 4 inches, thickness: 400 μm) was used as the substrate 3 and the substrate 3 was heated with a heater. Further, the substrate bias voltage was set to the potential of 25 V and the magnetic field was set to 180 gausses near the substrate. The formation period was 8 hours. Film thicknesses and discharge stabilities of diamond films formed are listed in Table 1.

TABLE 1

|  | Discharge Frequency | Film Thickness | Discharge Stability |
| --- | --- | --- | --- |
| Sample 1 | 42 MHz | 2 μm | AA |
| Sample 2 | 100 MHz | 4 μm | AA |
| Sample 3 | 200 MHz | 4 μm | A |
| Sample 4 | 250 MHz | 3 μm | B |
| Sample 5 | 27 MHz | not more than 1 μm | AA |
| Sample 6 | 280 MHz | no film formed | C |

AA: Very stable discharge
A: Stable discharge
B: Practically usable discharge
C: Unstable discharge As shown in Table 1, in Samples 1–4, diamond crystals were able to be formed at high forming rates and on a stable basis by adjusting the discharge frequency in the range of from 40 to 250 MHz in the inductive coupled plasma CVD method. Further, uniformity of the film thickness was as good as within ±10%.

The growing rate of diamond crystals was low in Sample 5, and formation of diamond was difficult in Sample 6 because discharge was not stable.

EXAMPLE 3

This example observed a dependence on application of magnetic field, of formation of diamond film by the plasma CVD method employing the inductive coupling discharge. The conditions for synthesis of diamond were the same as those in Example 1. Further, the substrate was kept at the ground potential and the formation period was 10 hours. Table 2 shows film thicknesses of diamond crystals formed.

TABLE 2

|  | Strength of Magnetic Field | Film Thickness |
| --- | --- | --- |
| Sample 7 | 100 Gausses | 2.5 μm |
| Sample 8 | 150 Gausses | 4.1 μm |
| Sample 9 | 200 Gausses | 5.0 μm |
| Sample 10 | 300 Gausses | 5.1 μm |

As seen from Table 2, the film thickness tends to increase as the strength of magnetic field increases over 150 gausses. This is conceivably because the application of magnetic field increased the plasma density.

EXAMPLE 4

This example observed a dependence on application of the bias voltage to the substrate, of formation of diamond film by the plasma CVD method employing the inductive coupling discharge.

The forming conditions were the same as those in Example 1 except that the substrate bias voltage was applied to the substrate. Table 3 shows the results. Here, crystallinities of diamond layers obtained were evaluated by the Raman spectral analysis. According to the Raman spectral analysis, a peak of diamond crystals appeared around 1333 $cm^{-1}$ as a sharp peak, and amorphous carbon or graphite carbon showed broad peaks around 1350 $cm^{-1}$ and 1580 $cm^{-1}$. In the present invention, the crystallinity was evaluated by existence of the peak of diamond crystal (1333 $cm^{-1}$) and the peak of amorphous carbon or graphite carbon (1580 $cm^{-1}$), and the ratio thereof (1333 $cm^{-1}$/1580 $cm^{-1}$). When the ratio 1333 $cm^{-1}$/1580 $cm^{-1}$ was 2 or more, the crystallinity was evaluated as very good (AA). When the ratio was not less than 1, the crystallinity was evaluated as good (A). When the ratio was less than 1 and the peak of diamond crystal was able to be recognized, a sample was regarded as showing crystallinity (B). Further, when no peak of diamond crystal was confirmed, a sample was regarded as showing no crystallinity (C).

TABLE 3

|  | Bias voltage to Substrate | Film Thickness | Crystallinity |
| --- | --- | --- | --- |
| Sample 11 | −20 V | not more than 1 μm | C |
| Sample 12 | 0 V | 2.5 μm | B |
| Sample 13 | +10 V | 2.5 μm | B |
| Sample 14 | +20 V | 4.0 μm | A |

TABLE 3-continued

|  | Bias voltage to Substrate | Film Thickness | Crystallinity |
|---|---|---|---|
| Sample 15 | +40 V | 5.1 μm | AA |
| Sample 16 | +50 V | 4.2 μm | A |
| Sample 17 | +60 V | 3.1 μm | B |

AA: Very good crystallinity
A: Good crystallinity
B: Showing crystallinity
C: Showing no crystallinity As seen from Table 3, an increase in the growing rate and an improvement in crystallinity were confirmed in the range of the substrate bias voltage between 20 V and 50 V.

EXAMPLE 5

This example observed effects of combination of application of the bias voltage to the substrate with application of the magnetic field to the vicinity of the substrate. Diamond crystals were formed in the same manner as in Example 1 except that the substrate bias voltage was set to 40 V and that the magnetic field was set to 200 gausses near the substrate. The film thickness was 7.2 μm, and according to the Raman spectral analysis, the ratio of peaks of diamond crystals and amorphous carbon or graphite carbon (1333 $cm^{-1}$/1580 $cm^{-1}$) was 2 or more, thus showing very good crystallinity. This example confirmed improvements in the diamond forming rate and the crystallinity by the combination of application of the substrate bias voltage with application of the magnetic field to the vicinity of the substrate.

EXAMPLE 6

A semiconductor diamond film was formed in this example, using the apparatus as shown in FIG. 1 and further using application of the substrate bias voltage and application of the magnetic field. The substrate was a silicon substrate (3 inches, thickness: 500 μm) and the starting gas was composed of $H_2$ gas: 100 ml/min, CO (carbon monoxide) gas: 4 ml/min, and $B_2H_2$ (diborane, 100 ppm hydrogen-diluted) gas: 2 ml/min. The pressure was 150 Pa, the magnetic field was 200 gausses in the vicinity of the substrate, and the substrate bias voltage was 28 V. Further, the frequency of the high-frequency wave was 100 MHz and the high-frequency power was 500 W. The substrate temperature was kept at 820° C. and the period of synthesis was 10 hours. A diamond thin film was formed in the thickness of about 5.2 μm on the substrate. The diamond film had the electrical resistivity of about 10 Ω·cm, which showed p-type semiconductor properties.

EXAMPLE 7

Figure 3:
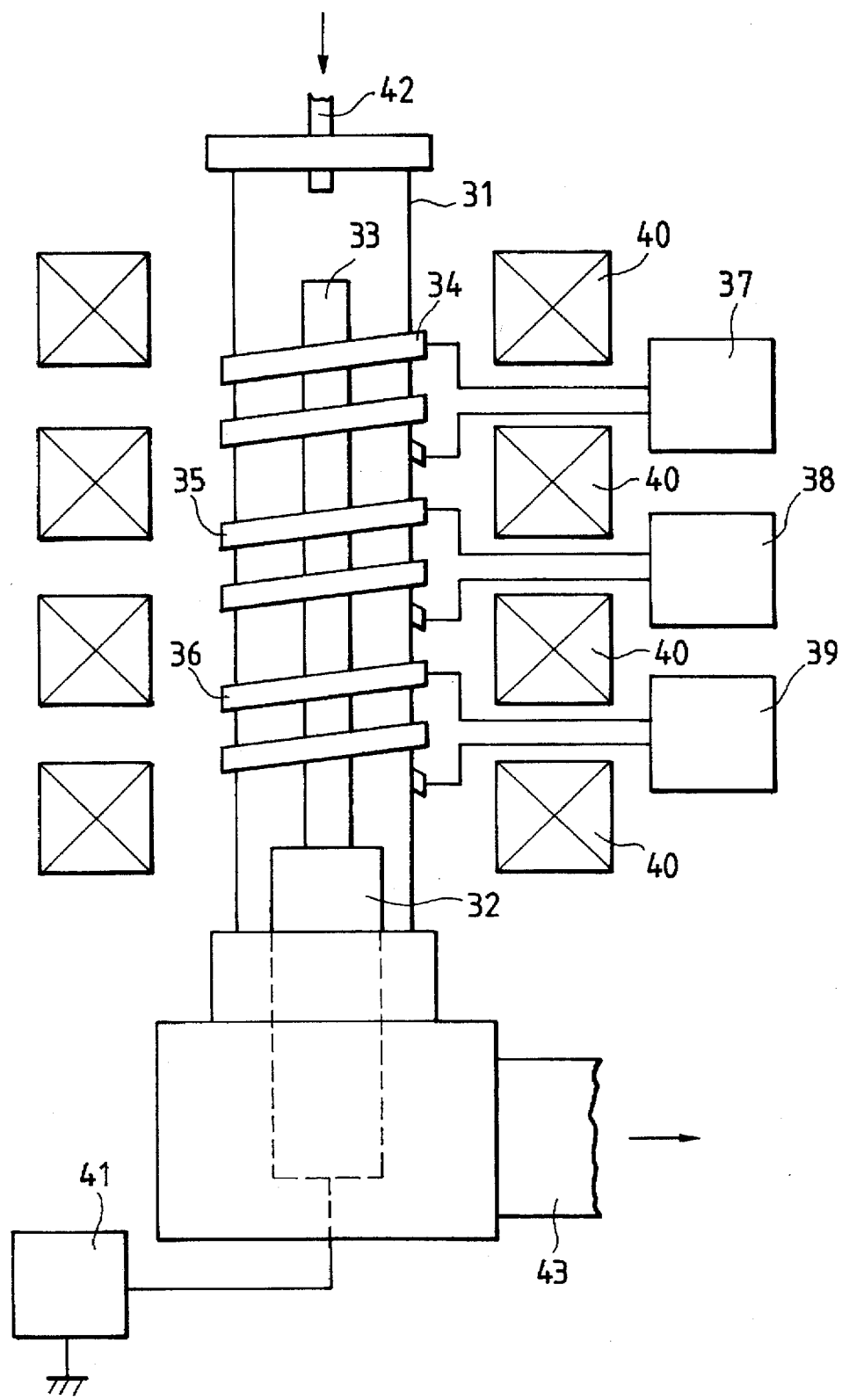
FIG. 3 shows another embodiment of the plasma CVD apparatus of the present invention.

In this example, a plurality of inductive coupling coils (three coils in the figure) were used, as shown in FIG. 3, to form a coating on a long-size sample. In FIG. 3, a substrate holder 32, arranged as capable of applying the substrate bias voltage, and a substrate 33 are disposed in a quartz reactor 31 arranged as capable of reducing the pressure therein. Inductive coupling coils 34, 35 and 36 are disposed outside the reactor, and are connected to a high-frequency power supply, not shown, via matching circuits 37, 38 and 39, respectively. Further, a magnetic field applying means 40 is disposed outside the inductive coupling coils in order to apply a magnetic field in the direction perpendicular to the substrate surface. Reference numeral 41 represents a power supply for the substrate bias voltage. Reference numeral 42 denotes a gas supply port, to which a valve, a gas cylinder, and a gas-flow-rate regulator, not shown, are connected. Reference numeral 43 designates a vacuum exhaust port, to which a valve, a turbo molecular pump, and a rotary pump, not shown, are connected. The substrate was a pipe (diameter: 2 cm, length: 40 cm) made of molybdenum and the starting gas was composed of $H_2$ gas: 200 ml/min and CO (carbon monoxide) gas: 10 ml/min. The pressure was 400 Pa, the magnetic field was 220 gausses in the vicinity of the substrate, and the substrate bias voltage was 32 V. Further, the frequency of the high-frequency wave was 120 MHz and the voltage of 650 W was supplied to each inductive coupling coil. The substrate was heated at 800° C. by plasma formed. A diamond thin film was formed in the thickness of about 5 μm on the substrate for the synthesis period of 8 hours. Here, variations of film thicknesses of the diamond film formed on the substrate were within ±10%, which was very good.

Diamond crystal thin films can be formed at high forming rates and in large areas by the present invention. Such a method for forming diamond crystals is applicable to methods for forming electronic materials, cutting tools, and wear-resisting members, and the industrial value thereof is high.

What is claimed is:

1. A method for forming a diamond film by high-frequency plasma chemical vapor deposition, which comprises:
   (a) introducing a starting gas containing carbon to a reaction space containing a substrate;
   (b) applying an inductive coupling discharge at a frequency from 40–250 MHz to said reaction space to form a plasma of said starting gas; and
   (c) applying a positive bias voltage in the range from 20V to 50V to said substrate to form a diamond film on the substrate.

2. The method for forming a diamond film according to claim 1, wherein a magnetic field is applied to the vicinity of the substrate to form the diamond film.

3. The method for forming a diamond film according to claim 2, wherein a strength of the magnetic field is set to at least 150 gausses in the vicinity of the substrate to form the diamond film.

4. The method for forming a diamond film according to claim 1, wherein a temperature of the substrate is set in the range of from 300° C. to 1200° C.

5. The method for forming a diamond film according to claim 1, wherein a pressure is set in the range of from 1 Pa to $10^4$ Pa.

6. The method for forming a diamond film according to claim 1, wherein a pressure is set in the range of from 10 Pa to $8 \times 10^3$ Pa.

7. The method for forming a diamond film according to claim 1, wherein at least two inductive coupling coils are used to form the diamond film.

* * * * *

UNITED STATES PATENT AND TRADEMARK OFFICE
CERTIFICATE OF CORRECTION

PATENT NO. : 5,720,808

DATED : February 24, 1998

INVENTOR(S) : KEIJI HIRABAYASHI, ET AL.

It is certified that error appears in the above-identified patent and that said Letters Patent is hereby corrected as shown below:

TITLE PAGE:

AT [56] REFERENCES CITED

OTHER PUBLICATIONS

After Meyer, D.E., et al. "$H_4/CH_1/O_2$" should read --$H_2/CH_4/O_2$--.

COLUMN 1

Line 12, "greatband" should read --great band--.

COLUMN 2

Line 62, "high" should read --high rate and over--.

COLUMN 3

Line 31, "supplied" should read --It therefore--; and
Line 36, "by" should read --by the--;
"coupling heat" should read --coupling--.

Signed and Sealed this

Twenty-ninth Day of September, 1998

Attest:

BRUCE LEHMAN

Attesting Officer      Commissioner of Patents and Trademarks